US012707867B2

(12) United States Patent
Kim et al.

(10) Patent No.: US 12,707,867 B2
(45) Date of Patent: Aug. 11, 2026

(54) DISPLAY DEVICE

(71) Applicant: LG DISPLAY CO., LTD., Seoul (KR)

(72) Inventors: SungHee Kim, Paju-si (KR); Dawoon Jeong, Seoul (KR); Jaebin Song, Seoul (KR); SuJeong Lee, Seoul (KR)

(73) Assignee: LG Display Co., Ltd. (KR)

( * ) Notice: Subject to any disclaimer, the term of this patent is extended or adjusted under 35 U.S.C. 154(b) by 954 days.

(21) Appl. No.: 17/978,796

(22) Filed: Nov. 1, 2022

(65) Prior Publication Data

US 2023/0180518 A1 Jun. 8, 2023

(30) Foreign Application Priority Data

Dec. 8, 2021 (KR) ........................ 10-2021-0174684

(51) Int. Cl.
*H10K 59/80* (2023.01)
*H10K 59/12* (2023.01)

(52) U.S. Cl.
CPC ........... *H10K 59/879* (2023.02); *H10K 59/12* (2023.02)

(58) Field of Classification Search
None
See application file for complete search history.

(56) References Cited

U.S. PATENT DOCUMENTS

2018/0194912 A1* 7/2018 Kim ......................... G02B 1/11
2019/0219875 A1* 7/2019 Jung ................. G02F 1/133514

FOREIGN PATENT DOCUMENTS

CN 105273559 A 1/2016
CN 106662691 A 5/2017
CN 107406608 A 11/2017
CN 107922756 A 4/2018
CN 108027451 A 5/2018
CN 108027455 A 5/2018
CN 108431639 A 8/2018
CN 109804277 A 5/2019
CN 110058446 A 7/2019
CN 111465665 A 7/2020
CN 112585221 A 3/2021
KR 10-2013-0120223 A 11/2013
KR 10-2014-0024484 A 2/2014
KR 10-2015-0019325 A 2/2015
KR 10-2017-0036624 A 4/2017

OTHER PUBLICATIONS

Chinese Notice of Allowance dated Mar. 6, 2024 issued in Patent Application No. 202211285335.3 w/English Translation (9 pages).
China Office Action dated Sep. 18, 2023 issued in Patent Application No. 2022112853353 w/English Translation (14 pages).

* cited by examiner

*Primary Examiner* — Andrew K Bohaty
(74) *Attorney, Agent, or Firm* — Fish & Richardson P.C.

(57) ABSTRACT

A display device includes a display panel which includes a plurality of sub pixels; and an optical control film which is disposed on the display panel and includes a convex pattern layer including a plurality of convex portions and a low refractive layer planarizing an upper surface of the convex pattern layer and having a refractive index lower than that of the convex pattern layer, and the low refractive layer includes a matrix polymerized with a polymer containing fluorinated urethane (meth)acrylate and polysilsesquioxane compounds and a monomer containing alkyl (meth)acrylate and fluorinated (meth)acrylate; and fluorine-modified inorganic particles dispersed in the matrix.

20 Claims, 3 Drawing Sheets

DISPLAY DEVICE

CROSS-REFERENCE TO RELATED APPLICATION

This application claims the priority of Korean Patent Application No. 10-2021-0174684 filed on Dec. 8, 2021, which is hereby incorporated by reference in its entirety.

BACKGROUND

Field of the Disclosure

The present disclosure relates to a display device, and more particularly, to a display device in which a shrinkage rate and a flatness are improved while allowing an inkjet process and an optical control film including a low refractive layer having a low refractive index is included to improve a display quality.

Description of the Background

Recently, as it enters an information era, a display field which visually expresses electrical information signals has been rapidly developed and in response to this, various display devices having excellent performances such as thin-thickness, light weight, and low power consumption have been developed. Specific examples of such a display device include a liquid crystal display (LCD) device, a plasma display panel (PDP) device, a field emission display (FED) device, and an organic light emitting display (OLED) device.

In the display device, an optical control film with various functions is disposed on the display panel to further improve light extraction efficiency and luminance. For example, when a plurality of lens patterns is formed on the display panel and a low refractive flattened layer is formed to cover the lens patterns, the light extraction efficiency may be improved by controlling a refractive index to improve the luminance.

In general, a composition for a low refractive flattened layer is coated on a lens pattern and is subjected to light irradiation and thermal treatment to form a low refractive flattened layer. However, a solvent added to the composition for the purpose of the easiness of coating and process is volatilized during the process so that the coating film shrinks. As described above, when the coating film shrinks, there is a problem in that a flatness of the low refractive flattened layer which is finally formed is degraded.

Further, a solvent included in the composition for the low refractive flattened layer dissolves the lens pattern to cause swelling and loss of the lens pattern, which limits the improvement of the light extraction efficiency.

Accordingly, a technique for forming a low refractive flattened layer using a solvent-free type composition that does not contain the solvent has been proposed. Even though the solvent-free type composition does not contain the solvent to reduce the shrinkage and the damage of the lens pattern, the refractive index is not sufficiently low, so that it is limited in improvement of the light extraction efficiency.

Further, the solvent-free type composition is disadvantageous in terms of coatability and particle dispersibility, so that it has a problem in the process, and it is difficult to form a low refractive flattened layer having uniform physical properties.

Further, the low refractive flattened layer is formed of a fluorine-based material having a low refractive index to achieve the low refractive characteristic. However, the wettability and the adhesiveness are lowered due to the physical properties of the fluorine-based material itself so that it is difficult to uniformly coat an upper surface of the lens pattern.

The above information disclosed in this Background section is only for enhancement of understanding of the background of the described technology and therefore it may contain information that does not form prior art that is already known to a person of ordinary skill in the art.

SUMMARY

Accordingly, the present disclosure is to provide a display device including a low refractive layer having an excellent optical characteristic by suppressing the increase of the refractive index due to the shrinkage, with an excellent flatness by minimizing the shrinkage during the process.

The present disclosure is also to minimize the damage of the pattern formed below the low refractive layer using a solvent-free type low refractive layer composition.

The present disclosure is also to provide a display device in which the coatability and the particle dispersibility of the solvent-free type composition are improved to have an advantage in the process and a low refractive layer having an excellent flatness is included.

Further, the present disclosure is to provide a display device which has an advantage in the process by improving the wettability and the coatability of the composition while lowering the refractive index using a fluorine-based material and includes a low refractive layer having an excellent optical characteristic.

Moreover, the present disclosure is to provide a display device which has an excellent display quality by improving a light extraction efficiency and a luminance.

The present disclosure is not limited to the above-mentioned, and other features, which are not mentioned above, can be clearly understood by those skilled in the art from the following descriptions.

According to an aspect of the present disclosure, a display device includes a display panel which includes a plurality of sub pixels; and an optical control film which is disposed on the display panel and includes a convex pattern layer including a plurality of convex portions and a low refractive layer planarizing an upper surface of the convex pattern layer and having a refractive index lower than that of the convex pattern layer, and the low refractive layer includes a matrix polymerized with a polymer containing fluorinated urethane (meth)acrylate and polysilsesquioxane compounds and a monomer containing alkyl (meth)acrylate and fluorinated (meth)acrylate; and fluorine-modified inorganic particles dispersed in the matrix.

Other detailed matters of the exemplary aspects are included in the detailed description and the drawings.

According to the present disclosure, the low refractive layer of the optical control film includes a fluorine-based material to have ultra-low refractive characteristic so that the display device has excellent light extraction efficiency and luminance.

Further, according to the present disclosure, even though the fluorine-based material is included, the wettability and the coatability of the low refractive composition are improved to have an advantage in the process. Further, an adhesiveness between a convex pattern layer and the low refractive layer is improved to improve the flatness and the reliability of the optical control film.

Further, according to the present disclosure, when the low refractive layer is formed, the shrinkage is minimized so that the flatness is excellent and the damage of the convex pattern layer may be minimized.

According to the present disclosure, a composition for a solvent-free type low refractive layer is used to form the low refractive layer by an inkjet process so that it is advantageous in the process and the shrinkage of the low refractive layer during the process is improved with the excellent coatability.

Further, according to the present disclosure, even though a solvent-free composition is used, the particle dispersibility is excellent so that the physical property of the low refractive layer is even and uniform.

Further, the low refractive layer according to the present disclosure has excellent wettability and coatability so that the low refractive layer is easily formed regardless of the shape of the convex pattern layer.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
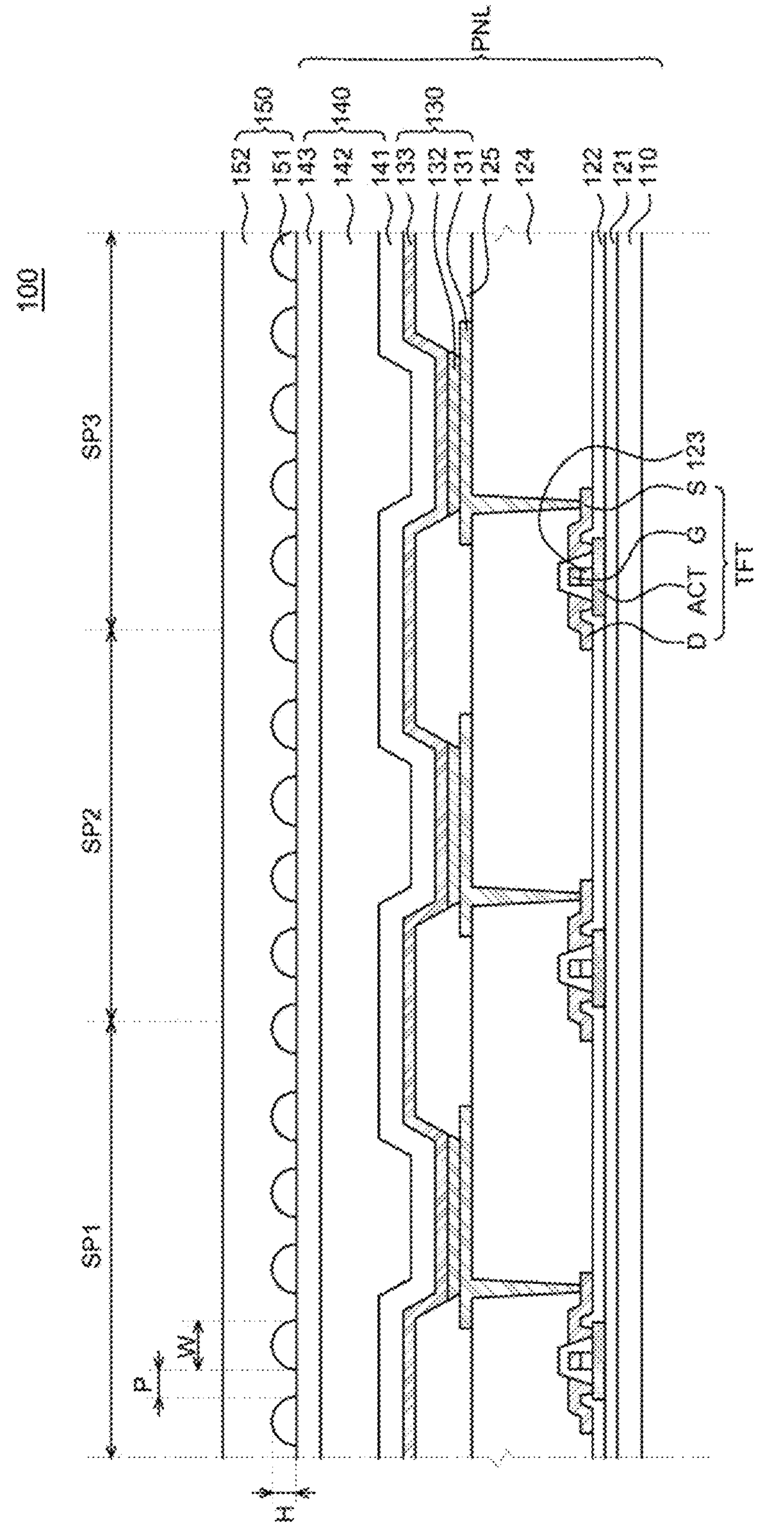
FIG. 1 is a cross-sectional view of a display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as “including,” “having,” and “consist of” used herein are generally intended to allow other components to be added unless the terms are used with the term “only”. Any references to singular may include plural unless expressly stated otherwise.

Components are interpreted to include an ordinary error range even if not expressly stated.

When the position relation between two parts is described using the terms such as “on”, “above”, “below”, and “next”, one or more parts may be positioned between the two parts unless the terms are used with the term “immediately” or “directly”.

When an element or layer is disposed “on” another element or layer, another layer or another element may be interposed directly on the other element or therebetween.

Although the terms “first”, “second”, and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, a display device according to exemplary aspects of the present disclosure will be described in detail with reference to accompanying drawings.

FIG. 1 is a schematic cross-sectional view of a display device according to an exemplary aspect of the present disclosure.

Referring to FIG. 1, a display device 100 according to the exemplary aspect of the present disclosure includes a display panel PNL and an optical control film 150 and the optical control film 150 includes a plurality of convex portions 151 and a low refractive layer 152.

The display panel PNL may be a liquid crystal display panel or an organic light emitting display panel. The liquid crystal display panel includes a liquid crystal layer and adjusts a light transmittance of liquid crystals to display images. The organic light emitting display panel includes an organic light emitting layer to display images using light emitted therefrom. The organic light emitting display panel is a self-emitting device which does not require a separate light source, unlike the liquid crystal display panel, and is thin and has an excellent flexibility. Hereinafter, for the convenience of description, the display device according to the exemplary aspect of the present disclosure will be described by assuming that the display panel PNL is an organic light emitting display panel, but is not limited thereto.

The display panel PNL includes areas which are defined as a display area and a non-display area. The display area is an area where a plurality of pixels is disposed to display images. In the display area, a pixel including a light emitting unit for displaying images and a driving circuit for driving the pixel may be disposed. The non-display area is disposed so as to enclose the display area. The non-display area is an area where images are not displayed and various wiring lines, driving ICs, and printed circuit boards for driving the pixels and the driving circuits disposed in the display area may be disposed. In the non-display area, various ICs such as a gate driver IC and a data driver IC may be disposed.

Each of the plurality of pixels includes a plurality of sub pixels SP1, SP2, and SP3. The sub pixels SP1, SP2, and SP3 are elements for displaying one color and include an emission area in which light is emitted and a non-emission area in which light is not emitted. For example, each of the plurality of pixels includes three sub pixels SP1, SP2, and SP3. When each of the plurality of pixels includes three sub pixels SP1, SP2, and SP3, the pixel may include a red sub pixel, a green sub pixel, and a blue sub pixel, but is not limited thereto. For example, each of the plurality of pixels may include four sub pixels. In this case, each of the plurality of pixels may include a red sub pixel, a green sub pixel, a blue sub pixel, and a white sub pixel.

Each of the plurality of sub pixels SP1, SP2, and SP3 may be disposed in a matrix form. For example, the plurality of sub pixels SP1, SP2, and SP3 may be disposed in a pentile structure, but is not limited thereto. Colors and arrangement of each of the sub pixels SP1, SP2, and SP3 may vary in various forms according to the necessity.

The display panel PNL includes a substrate 110, a buffer layer 121, a thin film transistor TFT, a planarization layer 124, an organic light emitting diode 130, a bank 125, and an encapsulation layer 140.

The substrate 110 is a base material which supports various elements which configure the display panel PNL. The substrate 110 may be formed of a material having excellent insulating property and anti-moisture permeability. For example, the substrate 110 may be a glass substrate or a plastic film, but is not limited thereto.

The buffer layer 121 is disposed on the substrate 110 to suppress permeation of oxygen or moisture. The buffer layer 121 may be formed as a single layer and may be formed with a multilayered structure as needed. For example, the buffer layer 121 may be formed of an inorganic material such as silicon oxide, silicon nitride, or silicon oxynitride, but is not limited thereto. The buffer layer 121 may be omitted when there is little influence of the moisture or oxygen or depending on the structure of the display device.

The thin film transistor TFT is disposed on the buffer layer 121. In the drawing, among various thin film transistors which may be included in the display device, only a driving thin film transistor is illustrated for the sake of convenience, but a switching thin film transistor and a capacitor may also be included.

The thin film transistor TFT is an element for driving each of the plurality of sub pixels. Accordingly, the thin film transistor TFT may be disposed on the buffer layer 121 so as to correspond to each of areas of the plurality of sub pixels SP1, SP2, and SP3. The thin film transistor TFT includes a gate electrode G, an active layer ACT, a source electrode S, and a drain electrode D. For example, the active layer ACT is disposed on the buffer layer 121 and a gate insulating layer 123 may be disposed on the active layer ACT to insulate the gate electrode G. Further, an interlayer insulating layer 122 may be disposed between the gate electrode G and the source electrode S and the drain electrode D to insulate from each other. Further, the source electrode S and the drain electrode D are disposed on the interlayer insulating layer 122 so as to be in contact with the active layer ACT. A configuration, a structure, and a placement of the thin film transistor TFT are not limited thereto and the thin film transistor may be formed with various configurations and structures.

The planarization layer 124 for planarizing the upper surface of the thin film transistor TFT is disposed on the thin film transistor TFT. The planarization layer 124 may include a contact hole which electrically connects the thin film transistor TFT and the organic light emitting diode 130.

The organic light emitting diode 130 is disposed on the planarization layer 124 so as to correspond to each of the plurality of sub pixels SP1, SP2, and SP3. The organic light emitting diode 130 includes an anode 131, an organic light emitting layer 132, and a cathode 133. The anode 131 is disposed on the planarization layer 124 and is electrically connected to the corresponding thin film transistor TFT. The anode 131 is formed to be separated for each of the plurality of sub pixels SP1, SP2, and SP3.

The bank 125 is disposed on the planarization layer 124 so as to expose at least a part of the anode 131. The bank 125 is disposed on the planarization layer 124 and is disposed so as to cover an end of the anode 131. The bank 125 divides adjacent sub pixels SP1, SP2, and SP3. Further, the bank 125 divides adjacent pixels. The bank 125 may be formed of an insulating material which insulates anodes 131 of adjacent sub pixels SP1, SP2, and SP3 from each other. Further, the bank 125 may be formed of a material having a high light absorptance to suppress color mixture between adjacent sub pixels SP1, SP2, and SP3.

The organic light emitting layer 132 is disposed on the anode 131. The organic light emitting layer 132 is a layer which includes an organic light emitting material to emit light. The organic light emitting layer 132 is configured to emit light of a color corresponding to each sub pixel SP1, SP2, and SP3. For example, the organic light emitting layer 132 of the red sub pixel emits red light.

The cathode 133 is disposed on the organic light emitting layer 132. The cathode 133 is not separated for each of the plurality of sub pixels SP1, SP2, and SP3, but is formed as one layer. However, it is not limited thereto and the cathode may be formed to be separated for each sub pixel SP1, SP2, and SP3 as needed.

The encapsulation layer 140 is disposed on the cathode 133. The encapsulation layer 140 protects the organic light emitting diode 130 from the external environment so as not to be degraded. Further, the encapsulation layer 140 planarizes an upper portion of the organic light emitting diode 130. For example, the encapsulation layer 140 may have a triple layered structure in which a first inorganic layer 141, an organic layer 142, and a second inorganic layer 143 are laminated in this order. However, it is not limited thereto and the encapsulation layer may be changed to various configurations as needed.

The optical control film 150 is disposed on the encapsulation layer 140. The optical control film 150 allows the light emitted from the organic light emitting diode 130 to be output to the outside without being lost due to the total reflection to improve the light extraction efficiency and the luminance of the display device 100. Therefore, when the display panel PNL operates as a top emission type, the optical control film 150 is disposed above the display panel PNL.

The optical control film 150 includes a convex pattern layer including a plurality of convex portions 151 and a low refractive layer 152.

The plurality of convex portions 151 is disposed on the display panel PNL. When the light emitted from the display panel PNL is incident onto the optical control film 150, light which is incident at an angle larger than a critical angle is not upwardly extracted at the interface of the display panel PNL and the optical control film 150, due to the total reflection. The plurality of convex portions 151 refracts light which is incident at an angle larger than the critical angle at an angle which is equal to or smaller than the critical angle to output the light to the outside of the display device 100 without being totally reflected. Accordingly, the light extraction efficiency of the display device 100 may be improved.

The convex portion 151 has a shape protruding from an upper surface of the display panel PNL toward an upper surface of the low refractive layer 152. For example, the convex portion 151 may have a dome shape and specifically, may have a hemisphere shape. Accordingly, on the cross-sectional view, an upper surface of each of the plurality of convex portions 151 may have a curved shape like an arch shape. In this case, the light extraction efficiency of the display device 100 may be further improved by controlling a refractive index. However, it is not limited thereto and a cross-sectional shape and an upper surface shape of the convex portion 151 may vary in various forms. For example, the cross-sectional shape of the convex portion 151 may be designed and changed in various forms such as a triangular shape, a trapezoidal shape, or a dome shape with a flat upper surface.

Each of the plurality of convex portions 151 is spaced apart from each other to be disposed in an island shape, but is not limited thereto. For example, the plurality of convex portions 151 is in contact with each other to be integrally formed with each other.

The convex portion 151 may have a circular shape or an oval shape on the plan view, but is not limited thereto. Further, the convex portion 151 may be formed to have a linear shape on the plan view. Each of the plurality of convex portions 151 has the same area and may be spaced apart from each other at a constant interval, on the plan view. Further, the plurality of convex portions 151 may be regularly disposed in a matrix form or may be disposed in a zigzag pattern. As another example, the plurality of convex portions 151 may include at least two types of convex portions having different diameters and may be disposed to be spaced apart from each other at different intervals.

For example, widths W of each of the plurality of convex portions 151 may be 1 μm to 30 μm or 10 μm to 30 μm. For example, heights H of each of the plurality of convex portions 151 may be 0.1 μm to 60 μm. For example, a distance P between adjacent convex portions 151 may be 5 μm or lower or 0.1 μm to 5 μm. In this case, an optical path control effect is further excellent so that the display device 100 having a higher light extraction efficiency may be provided. Further, the sense of the lattice by the non-emission area of the sub pixel SP1, SP2, and SP3 is improved so that the display quality of the display device 100 may be improved.

For example, a size of each of the plurality of convex portions 151 may be smaller than a size of each of the plurality of sub pixels SP1, SP2, and SP3. For example, a size of each of the plurality of convex portions 151 may be smaller than an emission area of each of the plurality of sub pixels SP1, SP2, and SP3. However, it is not limited thereto and a size of each of the plurality of convex portions 151 may be equal to a size of corresponding sub pixels SP1, SP2, and SP3. In the present disclosure, the emission area is defined as an area in which the organic light emitting layer 132 is formed between adjacent banks 125.

For example, a convex pattern layer including the plurality of convex portions 151 may be formed of a transparent resin such as polyethylene terephthalate, polycarbonate, or acryl-based resin, but is not limited thereto.

A base layer and/or an adhesive layer may be optionally disposed between the convex pattern layer and the display panel PNL as needed. That is, the plurality of convex portions 151 may be disposed to be in contact with an upper portion of the base layer and/or the adhesive layer disposed above the display panel PNL.

The low refractive layer 152 is disposed on the convex pattern layer including the plurality of convex portions 151. The low refractive layer 152 covers an area in which the plurality of convex portions 151 is disposed and an area in which the convex portions 151 are not disposed to planarize an upper surface of the convex pattern layer. The low refractive layer 152 is in contact with an upper surface of the plurality of convex portions and is also in contact with an upper surface of the display panel PNL in which the convex portion 151 is not disposed. An upper surface of the low refractive layer 152 has a flat surface.

The low refractive layer 152 is formed to have a refractive index which is lower than a refractive index of the convex pattern layer including a plurality of convex portions 151. Accordingly, light emitted through the convex pattern layer is refracted at the interface of the convex pattern layer and the low refractive layer 152 to be condensed onto the upper portion of the display device 100. Accordingly, the luminance and the light extraction effect of the display device 100 may be further improved.

For example, a refractive index of the low refractive layer 152 may have a value between the refractive index of air and the refractive index of the convex pattern layer. In this case, light incident from the convex pattern layer is refracted at the interface of the low refractive layer 152 and light output from the low refractive layer 152 onto the upper portion of the display device 100 is additionally refracted to improve the luminance and the light extraction effect of the display device 100. Specifically, for example, the refractive index of the low refractive layer 152 may be 1.45 or lower or 1.1 to 1.45. Within this range, a condensing effect of light which is incident onto the low refractive layer 152 is excellent to further improve the luminance and the light extraction effect of the display device 100. For example, the difference between the refractive index of the low refractive layer 152 and the refractive index of the convex pattern layer including the plurality of convex portions 151 may be 0.1 or larger, 0.5 or larger, or 1 or larger. As another example, a refractive index of the convex pattern layer may be 1.5 to 1.6. In this case, the luminance and the light extraction effect of the display device are further excellent.

The low refractive layer 152 is formed of a material in which fluorine-modified inorganic particles are dispersed in a matrix polymerized including a polymer and a monomer. For example, the low refractive layer 152 may be formed by curing a composition including a polymer, a monomer, fluorine modified inorganic particles, and an initiator. The composition may be cured by a photo curing method, but is not limited thereto.

Hereinafter, each component which constitutes a composition for forming the low refractive layer 152 will be described in detail.

Polymer includes fluorinated urethane (meth)acrylate and polysilsesquioxane compounds. The polymer including fluorinated urethane (meth)acrylate and polysilsesquioxane allows the low refractive layer 152 to maintain a ductility after being cured. Therefore, the low refractive layer 152 may be well adhered onto the convex pattern layer, and the adhesiveness between the low refractive layer 152 and the convex pattern layer is maintained to be high to improve the reliability of the optical control film 150. Further, the polymer including fluorinated urethane (meth)acrylate and polysilsesquioxane has a high light transmittance of 80% or higher or 90% or higher to have excellent optical characteristic. The fluorinated urethane (meth)acrylate includes a group containing fluorine in molecule and polysilsesquioxane is a silicon based material to contribute to realization of a low refractive characteristic.

The fluorinated urethane (meth)acrylate contains (per) fluoropolyether group in the molecule. The (per)fluoro polyether group is a functional group with a low refractive index. Therefore, the refractive index of the low refractive layer 152 is maintained to be sufficiently low to improve the light extraction efficiency of the display device 100.

For example, the fluorinated urethane (meth)acrylate is selected from compounds represented by the following Chemical Formula 1-1 or 1-2.

[Chemical Formula 1-1]

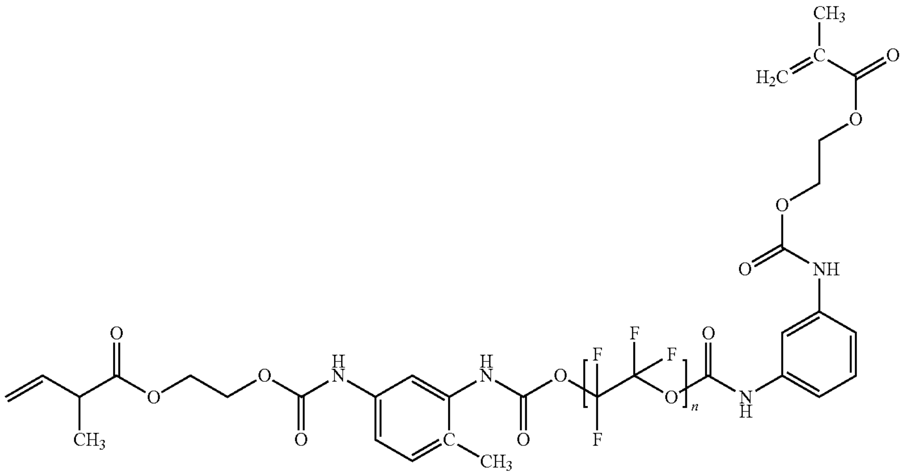

{Chemical Formula 1-2]

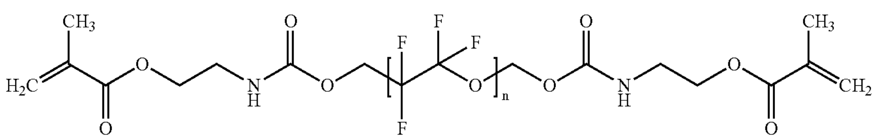

In the chemical formulae 1-1 and 1-2, n may each independently be an integer from 1 to 100.

The compounds represented by Chemical Formulae 1-1 and 1-2 contribute to securing a desired refractive index and have an excellent ductility to contribute to improvement of adhesiveness with the convex pattern layer.

Polysilsesquioxane contributes to securing a desired level of the refractive index of the low refractive layer 152. For example, polysilsesquioxane may be represented by the general formula $(RSiO_{1.5})_n$. Polysilsesquioxane may have various structures such as a random type, a ladder type, a cage type and a partial cage type.

For example, polysilsesquioxane may be polyhedral oligomeric silsesquioxane (POSS) having a cage structure. Specifically, for example, polyhedral oligomeric silsesquioxane may be a compound represented by the following Chemical Formula 2.

[Chemical Formula 2]

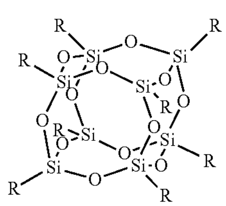

In Chemical Formula 2, R is each independently selected from a chain alkyl group having 1 to 30 carbon atoms, a branched alkyl group having 3 to 30 carbon atoms, a cycloalkyl group having 6 to 30 carbon atoms, an aryl group having 6 to 30 carbon atoms, an alkyl (meth)acrylate group, a monomer containing a vinyl group, and an oligomer containing a vinyl group. At this time, at least one of substituents R may be selected from alkyl(meth)acrylate group, a monomer containing a vinyl group, or an oligomer containing a vinyl group.

In Chemical Formula 2, when at least one R is alkyl(meth) acrylate group, a monomer containing a vinyl group, or an oligomer containing a vinyl group, R may react with (meth) acrylate of fluorinated urethane (meth)acrylate to be bonded during a curing process. That is, the polymer may be a copolymer of fluorinated urethane (meth)acrylate and polysilsesquioxane. In this case, the refractive index of the low refractive layer 152 is sufficiently low so that it is advantageous in that the light incident onto the low refractive layer 152 is effectively condensed and the physical property is uniform. Moreover, the luminance and the light extraction efficiency of the display device 100 may be improved.

The low refractive layer material of the related art has a problem in that the material is hardened, the shrinkage is seriously generated and, in this case, a refractive index of the low refractive layer formed after the curing is higher than the refractive index of the composition so that it is difficult to implement a low refractive characteristic. The polymer containing fluorinated urethane (meth)acrylate and polysilsesquioxane suppresses the shrinkage during the curing to suppress the increase of the refractive index, thereby contributing to improvement of the luminance and the light extraction efficiency of the display device.

The monomer serves as a cross linking agent during the process of curing the composition for forming the low refractive layer 152. The (meth)acrylate group included in each of the alkyl (meth)acrylate and the fluorinated (meth) acrylate binds to the reactive group contained in each of the fluorinated urethane (meth)acrylate and polysilsesquioxane to form a crosslinked copolymer.

Further, the monomer facilitates the control of the viscosity of the composition to provide the convenience in the process. When the polymer and the monomer are included to be polymerized to form the low refractive layer 152, the wettability and the coatability may be improved. Therefore, the adhesiveness between the low refractive layer 152 and the convex pattern layer is improved and the low refractive layer 152 having a uniform physical property and a high flatness is formed without causing an uncoated area. Further, when the polymer and the monomer are used together, the shrinkage during the curing is suppressed so that the increase of the refractive index may be suppressed.

Further, the monomer is introduced so that the inkjet process is possible. The monomer is added to control the viscosity of the composition to control the physical property suitable for the inkjet process.

For example, the monomer contains alkyl (meth)acrylate and fluorinated (meth)acrylate. A refractive index of the compound is 1.4 or lower so that the low refractive index is easily implemented and the adhesiveness with the convex pattern layer is improved.

For example, alkyl (meth)acrylate may be (meth)acrylate including an alkyl group having 1 to 20 carbon atoms. Specifically, for example, alkyl (meth)acrylate may be selected from ethyl (meth)acrylate, butyl (meth)acrylate, 2-ethyl hexyl (meth)acrylate, 2-(2-ethoxyethoxy) ethyl (meth)acrylate, and 2-[2-(2-methoxyethoxy) ethoxy]ethyl (meth)acrylate, but is not limited thereto.

The fluorinated (meth)acrylate may be (meth)acrylate containing the (per)fluoroalkyl group. For example, the fluorinated (meth)acrylate may be a compound represented by the following Chemical Formula 3. Specifically, for example, fluorinated (meth)acrylate may be selected from 2-perfluorohexyl ethyl (meth)acrylate and 3-perfluorohexyl propyl (meth)acrylate, but is not limited thereto.

[Chemical Formula 3]

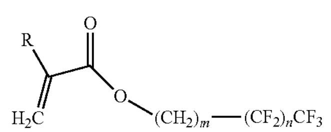

In Chemical Formula 3, R is hydrogen or a methyl group, m is an integer of 1 to 20, and n is an integer of 1 to 20.

In order to secure the adhesiveness, an upper surface of the convex pattern layer may be subjected to a hydrophobic surface treatment before forming the low refractive layer 152 and thus, a surface treatment layer may be disposed at the interface of the convex pattern layer and the low refractive layer 152. For example, the hydrophobic surface treatment may be performed by a known method in the art, such as corona discharge or ultrasonic treatment.

Fluorine-modified inorganic particles are dispersed in a polymerized matrix including polymer and monomer. The fluorine-modified inorganic particles control the refractive index of the low refractive layer to give an ultra-low refractive property. Accordingly, a condensing effect of light incident onto the low refractive layer is further improved to further improve the luminance and the light extraction efficiency of the display device.

For example, the fluorine-modified inorganic particles have a refractive index of 1.2 or lower. In this case, the low refractive layer 152 may have an ultra-low refractive property.

For example, the inorganic particles may be silica. The silica has advantages of low refractive index, excellent adhesiveness with the convex pattern layer, and easy surface modification.

For example, the inorganic particles may be spherical. As another example, the inorganic particles may have a hollow or porous structure. When the inorganic particles have a hollow or porous structure, the refractive index of the low refractive layer 152 may be implemented to be low.

Surfaces of the inorganic particles are modified with a fluorinated compound. The fluorine-modified inorganic particles have hydrophobicity and has compatibility with a fluorinated material based matrix. Accordingly, the fluorine-modified inorganic particles may be evenly and uniformly dispersed in the matrix. By doing this, the refractive index of the low refractive layer 152 is implemented to be low without increasing a haze of the low refractive layer 152 to provide an advantage of an excellent optical property.

For example, the inorganic particles may be surface-modified with (meth)acrylate including the (per)fluoroalkyl group. A (meth)acrylate group of the (meth)acrylate containing the (per)fluoroalkyl group is bonded to the surface of the inorganic particle and thus the (per)fluoroalkyl group encloses the inorganic particle surface. Therefore, the inorganic particle surface shows a hydrophobicity due to the (per)fluoroalkyl group.

Specifically, for example, the fluorine-modified inorganic particle includes silica, a first surface-modified portion which is bonded onto the silica surface and includes vinyl alkoxy silane, and a second surface-modified portion which is bonded with the first surface-modified portion and includes (meth)acrylate including (per)fluoroalkyl group.

Hereinafter, the first surface modified portion and the second surface modified portion will be described in detail by assuming that the inorganic particle is a silica having a hollow or porous structure.

The alkoxy silane group of vinyl alkoxy silane is bonded to the silica surface. Therefore, the vinyl group is introduced onto the silica surface to form the first surface-modified portion. For example, vinyl alkoxy silane may be a compound selected from vinyl trimethoxy silane and vinyl triethoxy silane.

The (meth)acrylate group of (meth)acrylate containing a (per)fluoroalkyl group is bonded with a vinyl group of the first surface modified portion. Specifically, the (meth)acrylate group and the vinyl group are bonded by an addition reaction. Accordingly, the (per)fluoroalkyl group is present in the outermost part of the fluorine-modified inorganic particles. For example, the (meth)acrylate containing the (per)fluoroalkyl group may be a compound represented by the following Chemical Formula 3. Specifically, the (meth) acrylate may be selected from 2-perfluorohexyl ethyl (meth) acrylate and 3-perfluorohexyl propyl (meth)acrylate, but is not limited thereto.

[Chemical Formula 3]

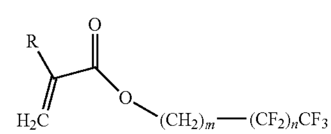

In Chemical Formula 3, R is hydrogen or a methyl group, m is an integer of 1 to 10, and n is an integer of 1 to 10.

The (meth)acrylate containing the (per)fluoroalkyl group which is used to form the second surface-modified portion is a hydrophobic compound so that it has a disadvantage in that it is difficult to react in an aqueous solvent. However, the surface modification reaction is secondarily performed using the (meth)acrylate including the (per)fluoroalkyl group which is a fluorinated compound, after forming the first surface-modified portion including vinyl alkoxy silane on the inorganic particle surface. By doing this, the fluorine-modified inorganic particles may be easily prepared with a high productivity.

The (per)fluoroalkyl group is present on the surface of the inorganic particles whose surface is modified with the (meth)acrylate containing vinyl alkoxy silane and (per) fluoroalkyl group, which is well compatible with the fluorinated material based matrix. Accordingly, the surface-modified inorganic particles have excellent dispersibility.

The initiator may be a photo-initiator. When the composition is thermally cured to form a low refractive layer, the deformation or discoloration may be caused due to the heat and the optical characteristic of the low refractive layer may be degraded due to the shrinkage. Therefore, it is desirable to form the low refractive layer by photo-curing using the photo initiator. For example, the initiator may be a phosphine oxide-based compound and/or a phenone-based compound, but is not limited thereto. Specifically, for example, diphenyl (2,4,6-trimethylbenzoyl) phosphine oxide, Irgacure TPO, or 2-hydroxy-2-methylpropiophenone may be used as the initiator.

The additive may be at least one selected from surfactants or coupling agents. The surfactant improves the leveling characteristic and the wettability of the composition to improve the adhesiveness between the convex pattern layer and the low refractive layer 152 and the flatness of the low refractive layer 152.

For example, the surfactant may be fluoro based surfactant. Specifically, for example, the fluoro based surfactant may be a compound represented by the following Chemical Formula 4-1 or 4-2.

[Chemical Formula 4-1]

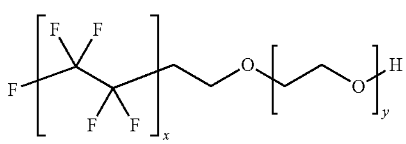

In Chemical Formula 4-1, x is an integer of 1 to 30 and y is an integer of 1 to 20.

[Chemical Formula 4-2]

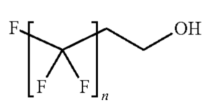

In Formula 4-2, n is an integer of 1 to 30.

The fluoro based surfactant has an excellent compatibility with the fluorinated material based matrix and improves the leveling characteristic and the flatness of the low refractive layer 152.

The coupling agent may be a silane-based coupling agent. This coupling agent improves the wettability to improve the adhesiveness between the convex pattern layer and the low refractive layer 152 and contribute to improvement the adhesive reliability.

For example, the silane-based coupling agent may be one or more selected from 3-methacryloxypropyl trimethoxysilane, glycidoxypropyl trimethoxysilane, 3-aminopropyl triethoxysilane, n-hexyl triethoxy silane, and n-octyl triethoxy silane.

For example, the low refractive layer may be a cured product formed by curing a composition containing 30 wt % to 55 wt % of a polymer, 35 wt % to 65 wt % of a monomer, 1 wt % to 30 wt % of fluorine-modified inorganic particles, and 0.5 wt % to 5 wt % of an initiator. Within this range, the flatness and the leveling characteristic of the low refractive layer 152 are excellent and the refractive index is low so that the optical characteristic is excellent.

As another example, the low refractive layer 152 may be a cured product formed by curing a composition containing 30 wt % to 55 wt % of a polymer, 35 wt % to 65 wt % of a monomer, 1 wt % to 30 wt % of fluorine-modified inorganic particles, 0.5 wt % to 5 wt % of an initiator, and 0.5 wt % to 5 wt % of an additive. Within this range, the flatness and the leveling characteristic of the low refractive layer 152 are excellent and the refractive index is low so that the optical characteristic is excellent. Accordingly, the luminance and the light extraction efficiency of the display device 100 may be improved.

The low refractive layer 152 of the present disclosure may be formed by a solvent-free composition. That is, the composition for forming the low refractive layer of the present disclosure may be a solvent-free composition which does not contain a solvent. The dispersibility of the fluorine-modified inorganic particles is excellent so that even though the solvent is not included, the problem caused by the dispersibility degradation is not caused.

Further, when the composition includes a solvent, there are problems in that a thermosetting process is additionally required to volatilize the solvent and the low refractive layer is shrunk while the solvent volatilizes. Therefore, there is a problem in that the refractive index of the low refractive layer is increased. Furthermore, the upper surface of the low refractive layer is not flat, and is formed with a conformal thickness along the interface of the convex pattern layer and the low refractive layer so that there is a problem in that the flatness is bad. However, the low refractive layer 152 of the present disclosure is produced from the solvent-free composition so that the thermosetting process is not necessary. The shrinkage of the low refractive layer 152 is suppressed during the curing process so that the low refractive layer 152 having a sufficiently low refractive index and a high flatness may be formed.

Further, there was a problem in that the solvent swelled the lower convex pattern layer, which caused the loss and the damage of the pattern. Therefore, it is limited to further improving the light extraction efficiency of the display device. The low refractive layer 152 of the present disclosure is formed with a solvent-free composition so that the loss and the damage problems of the convex portion 151 which constitutes the convex pattern layer is not caused.

Further, when the low refractive layer 152 is formed with the solvent-free composition, the low refractive layer 152 may be easily formed on the display panel PNL without causing a damage of the display panel PNL.

For example, the low refractive layer 152 may be formed by inkjet-printing a solvent-free composition. Accordingly, it contributes to increase of the process efficiency and the productivity.

The low refractive layer 152 is formed by a composition including various fluorinated materials to implement a low refractive index. However, there is a problem in that the wettability and the coatability of the composition including the fluorinated material are lowered due to a high surface tension and a low surface energy of fluorine. When the wettability and the coatability are lowered, the flatness of the low refractive layer is degraded to cause the problem in that the physical property in every area is not even. Further, when the plurality of convex portions has irregular arrangements or shapes, it is difficult for the composition to evenly spread so that the leveling characteristic is further degraded. For example, when the plurality of convex portions does not have the same shape, the intervals between convex portions are not equal, or the convex portions are formed with a linear pattern so that the shape and the arrangement are irregular, the flatness of the low refractive layer formed thereabove is further inferior.

However, as described above, the composition of the low refractive layer of the present disclosure including a specific polymer, monomer, fluorine-modified inorganic particles, and fluorinated surfactant is based on the fluorinated material. However, there are advantages in that the wettability and the coatability are excellent. Therefore, even though the low refractive layer 152 of the present disclosure has a low refractive characteristic, the low refractive layer has advantages of a high adhesiveness with the convex pattern layer, a uniform physical property without having an uncoated area, and a high flatness. Further, the composition of the present disclosure has excellent wettability and coatability so that there is an advantage in the process. Therefore, the composition is easily coated even on the convex pattern layer formed of convex portions 151 having an irregular shape that is difficult to secure the flatness or the leveling characteristic to form the low refractive layer 152 having an excellent levelling characteristic.

Hereinafter, the effects of the present disclosure will be described in more detail with reference to Examples. However, the following Examples are set forth to illustrate the present disclosure, but the scope of the disclosure is not limited thereto.

Example 1

First, a composition for a low refractive layer containing a polymer containing a fluorinated urethane (meth)acrylate represented by Chemical Formula 1-1 or 1-2 and POSS represented by Chemical Formula 2, a monomer containing ethyl acrylate (or butyl acrylate or 2-ethyl hexyl acrylate) and 2-perfluorohexyl ethyl acrylate, fluorine-modified hollow silica represented by the following Chemical Formula 5, diphenyl (2,4,6-trimethylbenzoyl) phosphine oxide, fluoro based surfactant represented by Chemical Formula 4-1, and 3-methacryloxypropyl trimethoxysilane was prepared.

[Chemical Formula 5]

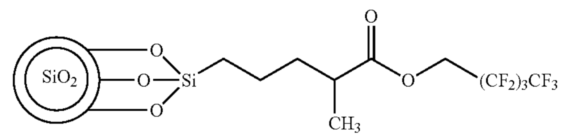

The convex pattern layer with a structure as illustrated in FIG. 1 was formed on a base film. The composition was coated on the convex pattern layer by an inkjet printing method (condition: pulse width 8 μm, frequency 1000, voltage 100 V, device: inkjet Unijet, head QS250 of Dimatix), and photo-cured to form a low refractive layer. The optical control film prepared as described above was laminated on an organic light emitting display panel including a red sub pixel, a green sub pixel, a blue sub pixel, and a white sub pixel to manufacture the display device as illustrated in FIG. 1.

Comparative Example 1

A low refractive layer composition including a polymer containing polyurethane acrylate represented by the following Chemical Formula a and POSS represented by Chemical Formula 2, and propylene glycol monomethyl ether acetate (PGMEA) and diphenyl (2,4,6-trimethylbenzoyl) phosphine oxide as solvents was prepared.

The low refractive layer composition prepared as described above was coated on the convex pattern layer prepared by the same method as Example 1 by an ink drop method. After coating, photo-curing and thermosetting were performed to form the low refractive layer. The optical control film prepared as described above was laminated on an organic light emitting display panel including a red sub pixel, a green sub pixel, a blue sub pixel, and a white sub pixel to produce the display device as illustrated in FIG. 1.

[Chemical Formula a]

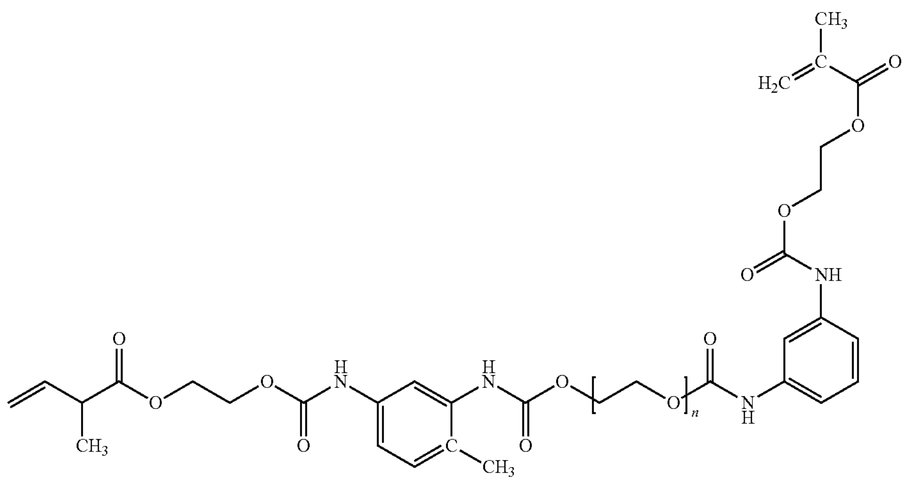

Comparative Example 2

In the composition for the low refractive layer of Example 1, except that a siloxane compound represented by the following Chemical Formula b was added instead of 2-perfluorohexyl ethyl acrylate, and an un-surface modified hollow silica was added instead of a fluorine-modified hollow silica represented by Chemical Formula 5, the display device was prepared by the same condition and method as Example 1.

[Chemical Formula b]

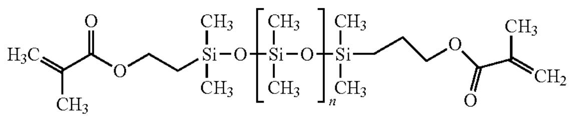

Experimental Example

Refractive indexes of compositions and low refractive layers according to each of Example 1 and Comparative Examples 1 and 2 were measured and the result thereof was represented in the following Table 1.

TABLE 1

| | Example 1 | Comparative Example 1 | Comparative Example 2 |
|---|---|---|---|
| Refractive index of composition | 1.38 | 1.44 | 1.44 |
| Refractive index of low refractive layer | 1.40 | 1.48 | 1.46 |
| Difference of refractive indexes | 0.02 | 0.04 | 0.05 |

Referring to Table 1, it was confirmed that a difference between a refractive index of the low refractive layer composition and a refractive index of the low refractive layer formed by curing the composition according to Example 1 of the present disclosure and Comparative Example 2 was smaller than that of Comparative Example 1. It was considered that in Example 1 and Comparative Example 2, a solvent-free low refractive composition which did not contain a solvent was used so that the shrinkage due to the solvent volatilization was suppressed. In contrast, in Comparative Example 1, it was determined that the composition included a solvent and thus the refractive index was significantly increased due to the shrinkage according to the solvent volatilization during the thermosetting process.

In the meantime, it was confirmed that the refractive index of the low refractive layer according to Example 1 was 1.40 which was much lower than a refractive index of the low refractive layer according to each of Comparative Examples 1 and 2. Specifically, it was confirmed that the low refractive layer according to Example 1 had a refractive index lower than that of a fluorinated material based low refractive layer of Comparative Example 2. The low refractive layer of Example 1 was different from that of Comparative Example 2 that a fluorinated (meth)acrylate compound and fluorine-modified inorganic particles were included. Therefore, it was confirmed that the fluorinated (meth)acrylate compound and fluorine-modified inorganic particles contributed to implementing the ultra-low refractive characteristic.

Figure 2:
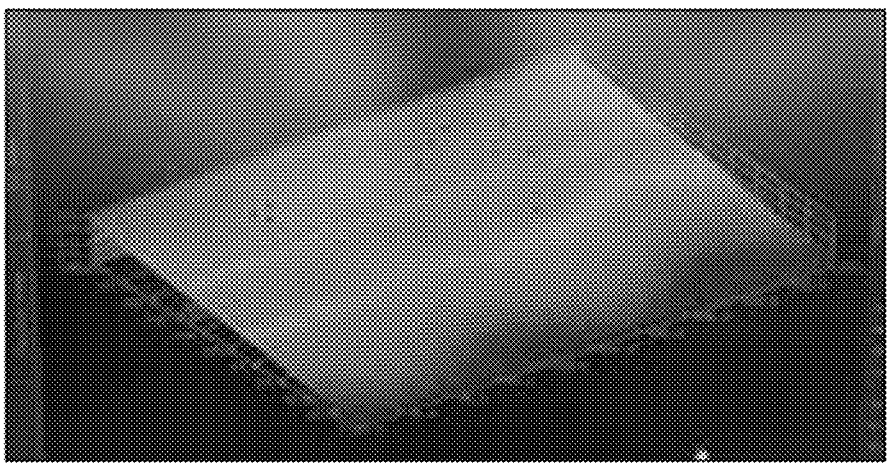
FIG. 2 is a 3D micrograph of a low refractive layer according to Example 1 of the present disclosure.
Figure 3:
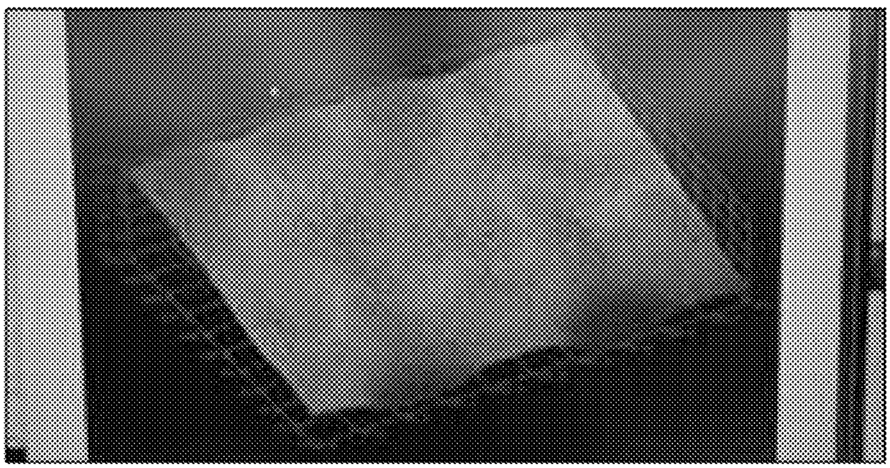
FIG. 3 is a 3D micrograph of a low refractive layer according to Comparative Example 2.

Further, in order to determine the spreadability and the flatness of the composition according to each of Example 1 and Comparative Example 2, after coating each composition on the substrate, a surface was observed through a 3D microscope. The result was illustrated in FIGS. 2 and 3. FIG. 2 is a 3D micrograph of a low refractive layer according to Example 1 and FIG. 3 is a 3D micrograph of a low refractive layer according to Comparative Example 2. Referring to FIGS. 2 and 3 together, it was understood that even though the low refractive layers were formed by the inkjet printing method under the same condition in both Example 1 and Comparative Example 2, a surface of the low refractive layer of Example 1 was more uniform and flatter than the surface of the low refractive layer of Comparative Example 2. By doing this, it was determined that the composition according to Example 1 had wettability and coatability better than those of the composition of Comparative Example 2 and a result that a surface characteristic of Example 1 was much better than that of Comparative Example 2 was shown.

Further, a luminous efficiency for each of red, green, blue, and white color of the display device according to Example 1 and Comparative Example 2 was evaluated and the result thereof was represented in Table 2.

TABLE 2

| | Example 1 | Comparative Example 2 |
|---|---|---|
| Red | 130.6% | 115.6% |
| Green | 139.5% | 123.8% |
| Blue | 119.4% | 110.2% |
| White | 128.4% | 116.2% |

Referring to Table 2, it was confirmed that the luminous efficiencies for all red, green, blue, and white color of the display device of Example 1 were excellent as compared with Comparative Example 2. It was because the low refractive layer formed by a composition for a low refractive layer according to the exemplary aspect of the present disclosure was included so that the light was condensed to the outside of the display device without having lost light due to the total reflection therein, thereby improving the efficiency.

The exemplary aspects of the present disclosure can also be described as follows:

According to an aspect of the present disclosure, a display device comprise a display panel which includes a plurality of sub pixels; and an optical control film which is disposed on the display panel and includes a convex pattern layer including a plurality of convex portions and a low refractive layer planarizing an upper surface of the convex pattern layer and having a refractive index lower than that of the convex pattern layer, wherein the low refractive layer includes a matrix polymerized with a polymer containing fluorinated urethane (meth)acrylate and a polysilsesquioxane compound and a monomer containing alkyl (meth) acrylate and fluorinated (meth)acrylate; and fluorine-modified inorganic particles dispersed in the matrix.

The polymer may be a copolymer of the fluorinated urethane (meth)acrylate and the polysilsesquioxane compound.

The polysilsesquioxane compound may be polyhedral oligomeric silsesquioxane.

The polyhedral oligomeric silsesquioxane may be a compound represented by the following Chemical Formula 2.

[Chemical Formula 2]

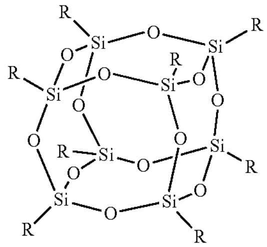

(in Chemical Formula 2, R may be each independently selected from a chain alkyl group having 1 to 30 carbon atoms, a branched alkyl group having 3 to 30 carbon atoms, a cycloalkyl group having 6 to 30 carbon atoms, an aryl group having 6 to 30 carbon atoms, an alkyl (meth) acrylate group, a monomer containing a vinyl group, and an oligomer containing a vinyl group and in Chemical Formula 2, at least one R may be alkyl (meth)acrylate group, a monomer containing a vinyl group, or an oligomer containing a vinyl group.)

The fluorinated urethane (meth)acrylate may be urethane (meth)acrylate containing (per)fluoro polyester group in a molecule.

The fluorinated urethane (meth)acrylate may be a compound represented by the following Chemical Formula 1-1 or 1-2.

[Chemical Formula 3]

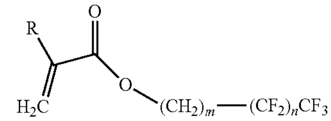

(In Chemical Formula 3, R may be hydrogen or a methyl group, m may be an integer of 1 to 20, and n may be an integer of 1 to 20.)

The fluorine-modified inorganic particles may have a hollow structure or a porous structure.

The fluorine-modified inorganic particles may be silica which is surface-modified with (meth)acrylate containing (per)fluoroalkyl group.

The fluorine-modified inorganic particle may include a first surface-modified portion which is bonded onto the silica surface and includes vinyl alkoxy silane, and a second surface-modified portion which is bonded with the first surface-modified portion and includes (meth)acrylate including (per)fluoroalkyl group.

The vinyl alkoxy silane may be selected from vinyl trimethoxy silane or vinyl triethoxy silane and the (meth) acrylate containing the (per)fluoroalkyl group may be a

[Chemical Formula 1-1]

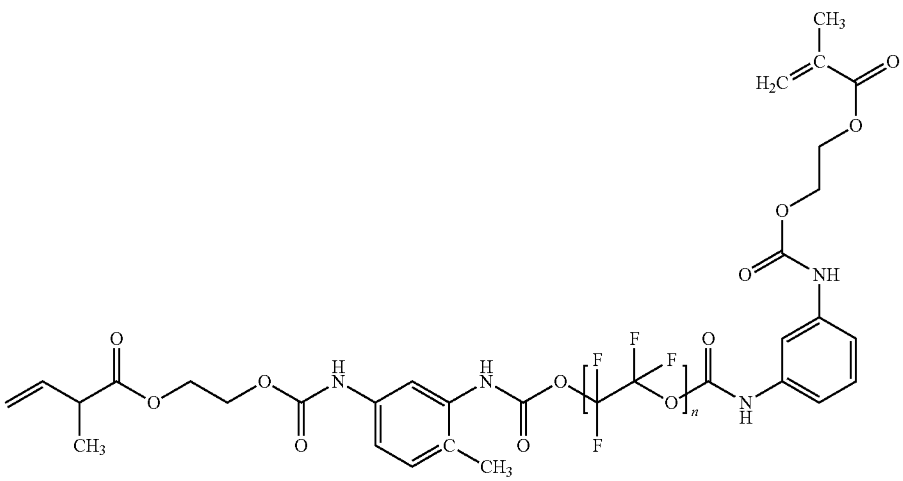

{Chemical Formula 1-2]

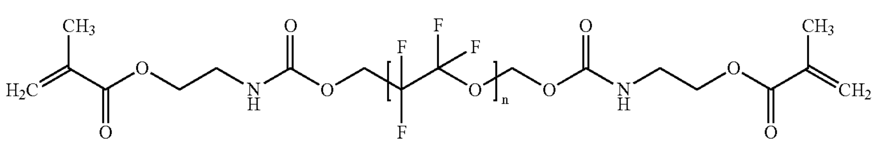

(In each of Chemical Formulae 1-1 and 1-2, n may be an integer of 1 to 100.)

The alkyl (meth)acrylate may be (meth)acrylate containing an alkyl group of 1 to 20 carbon atoms and the fluorinated (meth)acrylate may be (meth)acrylate containing (per)fluoroalkyl group.

The (meth)acrylate containing the (per)fluoroalkyl group may be a compound represented by the following Chemical Formula 3.

compound represented by the following Chemical Formula 3.

[Chemical Formula 3]

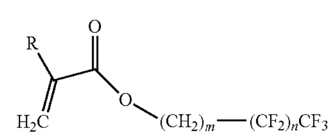

(In Chemical Formula 3, R may be hydrogen or a methyl group, m may be an integer of 1 to 20, and n may be an integer of 1 to 20.)

The low refractive layer may be a cured product of a composition containing 30 wt % to 55 wt % of the polymer, 35 wt % to 65 wt % of the monomer, and 1 wt % to 30 wt % of the fluorine-modified inorganic particles.

The composition may be a solvent-free composition which does not include a solvent.

The composition may further include 0.5 wt % to 5 wt % of an additive.

The additive may include a fluoro based surfactant, a silicon based coupling agent, or both of them.

The composition may further include 0.5 wt % to 5 wt % of an initiator.

A refractive index of the low refractive layer may be 1.45 or lower.

The plurality of convex portions may be spaced apart from each other to be disposed as an island shape.

A width of each of the plurality of convex portions may be 1 μm to 30 μm, a height may be 0.1 μm to 60 μm, and a distance between adjacent convex portions may be 5 μm or smaller.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:

a display panel which includes a plurality of sub pixels; and an optical control film disposed on the display panel and including a convex pattern layer including a plurality of convex portions and a low refractive layer planarizing an upper surface of the convex pattern layer and having a refractive index lower than that of the convex pattern layer, wherein the low refractive layer includes a matrix polymerized with a polymer containing fluorinated urethane (meth)acrylate and a polysilsesquioxane compound and a monomer containing alkyl (meth)acrylate and fluorinated (meth)acrylate; and fluorine-modified inorganic particles dispersed in the matrix.

2. The display device according to claim 1, wherein the polymer is a copolymer of the fluorinated urethane (meth) acrylate and the polysilsesquioxane compound.

3. The display device according to claim 1, wherein the polysilsesquioxane compound is polyhedral oligomeric silsesquioxane.

4. The display device according to claim 3, wherein the polyhedral oligomeric silsesquioxane is a compound represented by the following Chemical Formula 2,

[Chemical Formula 2]

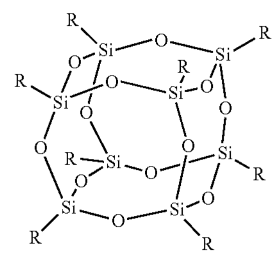

wherein R is each independently selected from a chain alkyl group having 1 to 30 carbon atoms, a branched alkyl group having 3 to 30 carbon atoms, a cycloalkyl group having 6 to 30 carbon atoms, an aryl group having 6 to 30 carbon atoms, an alkyl (meth)acrylate group, a monomer containing a vinyl group, and an oligomer containing a vinyl group and in Chemical Formula 2, at least one R is alkyl (meth)acrylate group, a monomer containing a vinyl group, or an oligomer containing a vinyl group.

5. The display device according to claim 1, wherein the fluorinated urethane (meth)acrylate is urethane (meth)acrylate containing (per)fluoro polyester group in a molecule.

6. The display device according to claim 5, wherein the fluorinated urethane (meth)acrylate is a compound represented by the following Chemical Formula 1-1 or 1-2,

[Chemical Formula 1-1]

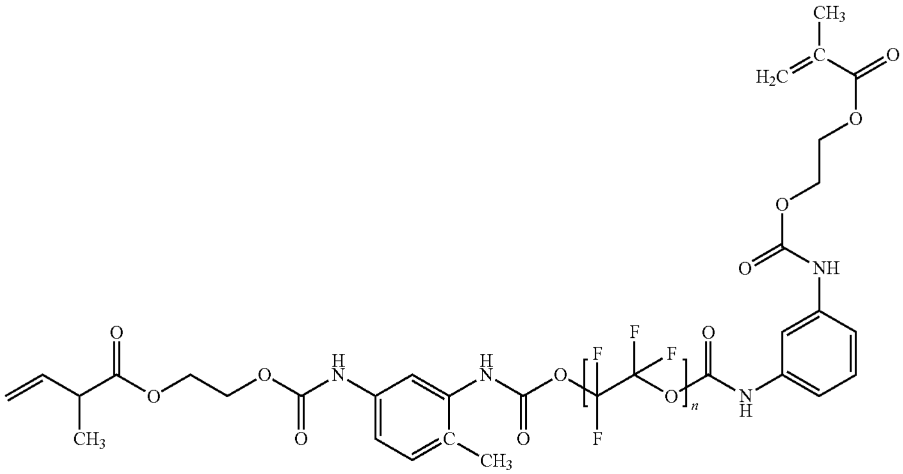

{Chemical Formula 1-2]

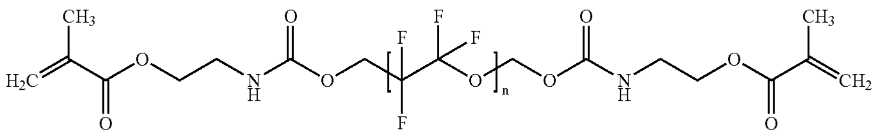

wherein n is an integer of 1 to 100 in each of Chemical Formulae 1-1 and 1-2.

7. The display device according to claim 1, wherein the alkyl (meth)acrylate is (meth)acrylate containing an alkyl group of 1 to 20 carbon atoms and the fluorinated (meth) acrylate is (meth)acrylate containing (per)fluoroalkyl group.

8. The display device according to claim 7, wherein the (meth)acrylate containing the (per)fluoroalkyl group is a compound represented by the following Chemical Formula 3,

[Chemical Formula 3]

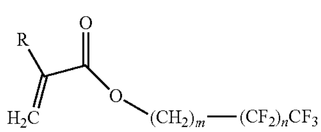

wherein R is hydrogen or a methyl group, m is an integer of 1 to 20, and n is an integer of 1 to 20.

9. The display device according to claim 1, wherein the fluorine-modified inorganic particles have a hollow structure or a porous structure.

10. The display device according to claim 1, wherein the fluorine-modified inorganic particles are silica which is surface-modified with (meth)acrylate containing (per)fluoroalkyl group.

11. The display device according to claim 10, wherein the fluorine-modified inorganic particle includes a first surface-modified portion which is bonded onto the silica surface and includes vinyl alkoxy silane, and a second surface-modified portion which is bonded with the first surface-modified portion and includes (meth)acrylate including (per)fluoroalkyl group.

12. The display device according to claim 11, wherein the vinyl alkoxy silane is selected from vinyl trimethoxy silane or vinyl triethoxy silane and the (meth)acrylate containing the (per)fluoroalkyl group is a compound represented by the following Chemical Formula 3,

[Chemical Formula 3]

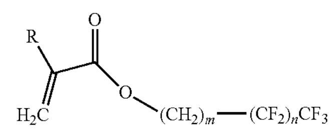

wherein R is hydrogen or a methyl group, m is an integer of 1 to 20, and n is an integer of 1 to 20.

13. The display device according to claim 1, wherein the low refractive layer is a cured product of a composition containing 30 wt % to 55 wt % of the polymer, 35 wt % to 65 wt % of the monomer, and 1 wt % to 30 wt % of the fluorine-modified inorganic particles.

14. The display device according to claim 13, wherein the composition is a solvent-free composition which does not include a solvent.

15. The display device according to claim 13, wherein the composition further includes 0.5 wt % to 5 wt % of an additive.

16. The display device according to claim 15, wherein the additive includes a fluoro based surfactant, a silicon based coupling agent, or both of them.

17. The display device according to claim 13, wherein the composition further includes 0.5 wt % to 5 wt % of an initiator.

18. The display device according to claim 1, wherein a refractive index of the low refractive layer is 1.45 or lower.

19. The display device according to claim 1, wherein the plurality of convex portions is spaced apart from each other and disposed as an island shape.

20. The display device according to claim 1, wherein a width of each of the plurality of convex portions is 1 μm to 30 μm, a height is 0.1 μm to 60 μm, and a distance between adjacent convex portions is 5 μm or smaller.

* * * * *